(12) United States Patent
Shen et al.

(10) Patent No.: US 9,178,653 B2
(45) Date of Patent: Nov. 3, 2015

(54) VERY SHORT SIZE LDPC CODING FOR PHYSICAL AND/OR CONTROL CHANNEL SIGNALING

(71) Applicant: BROADCOM CORPORATION, Irvine, CA (US)

(72) Inventors: Ba-Zhong Shen, Irvine, CA (US); Avi Kliger, Ramat Gan (IL); Tak K. Lee, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 71 days.

(21) Appl. No.: 14/068,534

(22) Filed: Oct. 31, 2013

(65) Prior Publication Data

US 2014/0201592 A1    Jul. 17, 2014

Related U.S. Application Data

(60) Provisional application No. 61/753,267, filed on Jan. 16, 2013, provisional application No. 61/768,035, filed on Feb. 22, 2013, provisional application No. 61/809,647, filed on Apr. 8, 2013, provisional application No. 61/820,651, filed on May 7, 2013, provisional application No. 61/822,871, filed on May 13, 2013, provisional application No. 61/825,322, filed on May 20, 2013, provisional application No. 61/834,825, filed on Jun. 13, 2013, provisional application No. 61/886,136, filed on Oct. 3, 2013.

(51) Int. Cl.
*H03M 13/11* (2006.01)
*H04L 1/00* (2006.01)
*H03M 13/00* (2006.01)

(52) U.S. Cl.
CPC ........... *H04L 1/0041* (2013.01); *H03M 13/116* (2013.01); *H03M 13/118* (2013.01); *H03M 13/1137* (2013.01); *H03M 13/1185* (2013.01); *H03M 13/6362* (2013.01)

(58) Field of Classification Search
CPC .......... H03M 13/1185; H03M 13/116; H03M 13/1188; H03M 13/1137; H03M 13/1174; H03M 13/118; H03M 13/616; H03M 13/6362
USPC .................................. 714/752, 758, 801, 790
See application file for complete search history.

(56) References Cited

U.S. PATENT DOCUMENTS

| | | | | |
|---|---|---|---|---|
| 7,395,494 B2* | 7/2008 | Lee et al. | ....... | 714/801 |
| 7,617,439 B2* | 11/2009 | Shen et al. | ....... | 714/784 |
| 7,752,521 B2* | 7/2010 | Livshitz | ....... | 714/752 |

(Continued)

*Primary Examiner* — James C Kerveros
(74) *Attorney, Agent, or Firm* — Garlick & Markison; Shayne X. Short

(57) ABSTRACT

A communication device is configured to encode and/or decode low density parity check (LDPC) coded signals. Such LDPC coded signals are characterized by LDPC matrices having a particular form. An LDPC matrix may be partitioned into a left hand side matrix and the right hand side matrix. The right hand side matrix can be lower triangular such that all of the sub-matrices therein are all-zero-valued sub-matrices (e.g., all of the elements within an all-zero-valued sub-matrix have the value of "0") except for those sub-matrices located on a main diagonal of the right hand side matrix and another diagonal that is adjacently located to the left of the main diagonal. A device may be configured to employ different LDPC codes having different LDPC matrices for different LDPC coded signals. The different LDPC matrices may be based generally on a common form (e.g., with a right hand side matrix as described above).

20 Claims, 9 Drawing Sheets

(56) References Cited

U.S. PATENT DOCUMENTS

| | | | |
|---|---|---|---|
| 7,802,172 B2* | 9/2010 | Vila Casado et al. | 714/801 |
| 7,917,829 B2* | 3/2011 | Livshitz | 714/752 |
| 8,140,930 B1* | 3/2012 | Maru | 714/752 |
| 8,196,012 B2* | 6/2012 | Lau et al. | 714/758 |
| 8,433,984 B2* | 4/2013 | Khandekar et al. | 714/779 |
| 8,464,123 B2* | 6/2013 | Alrod et al. | 714/752 |
| 8,631,299 B2* | 1/2014 | Sugihara et al. | 714/751 |

* cited by examiner

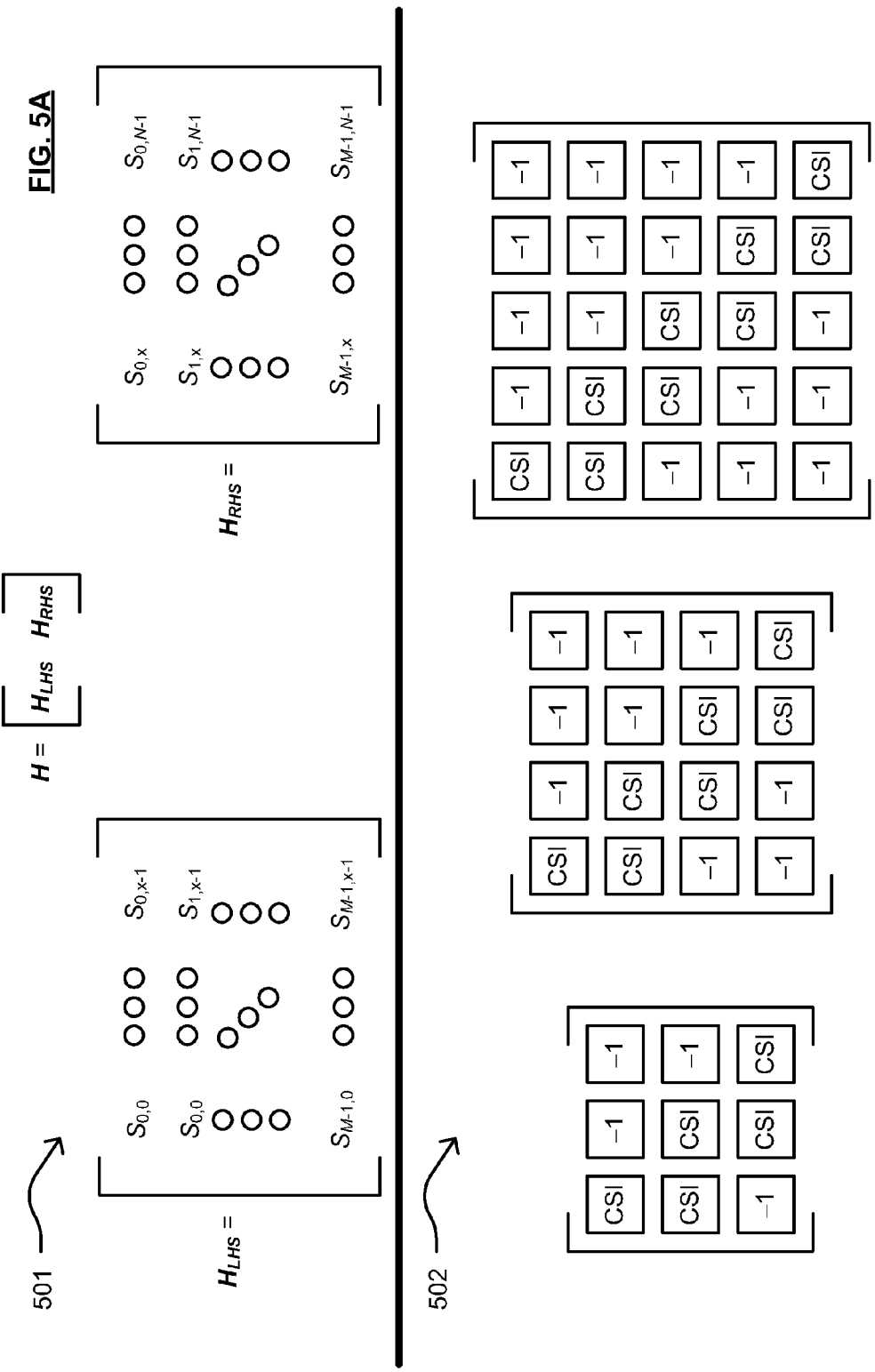

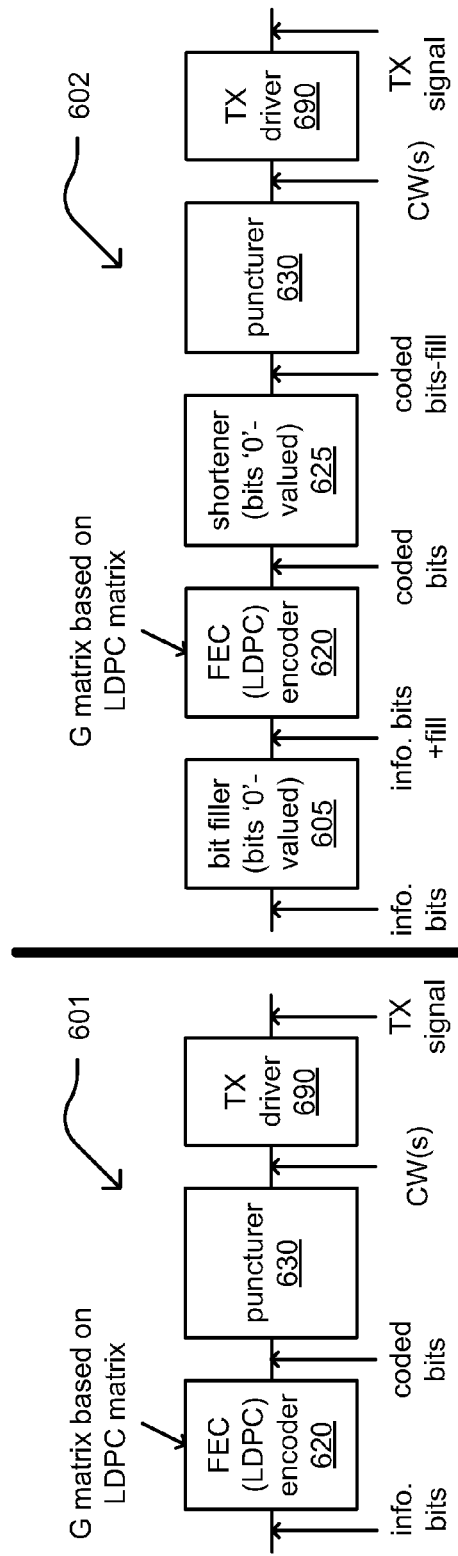
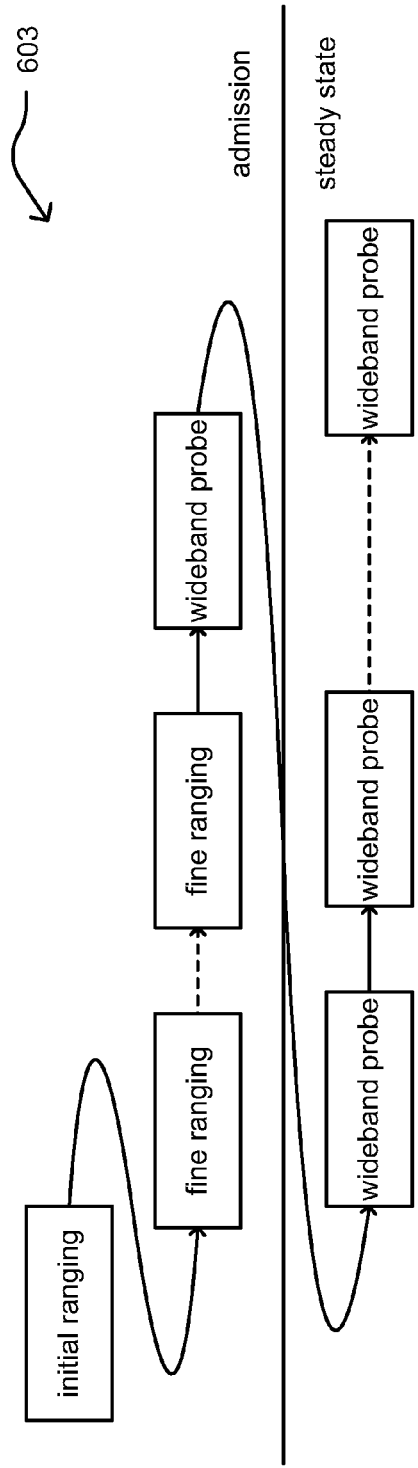
FIG. 6A
FIG. 6B
FIG. 6C

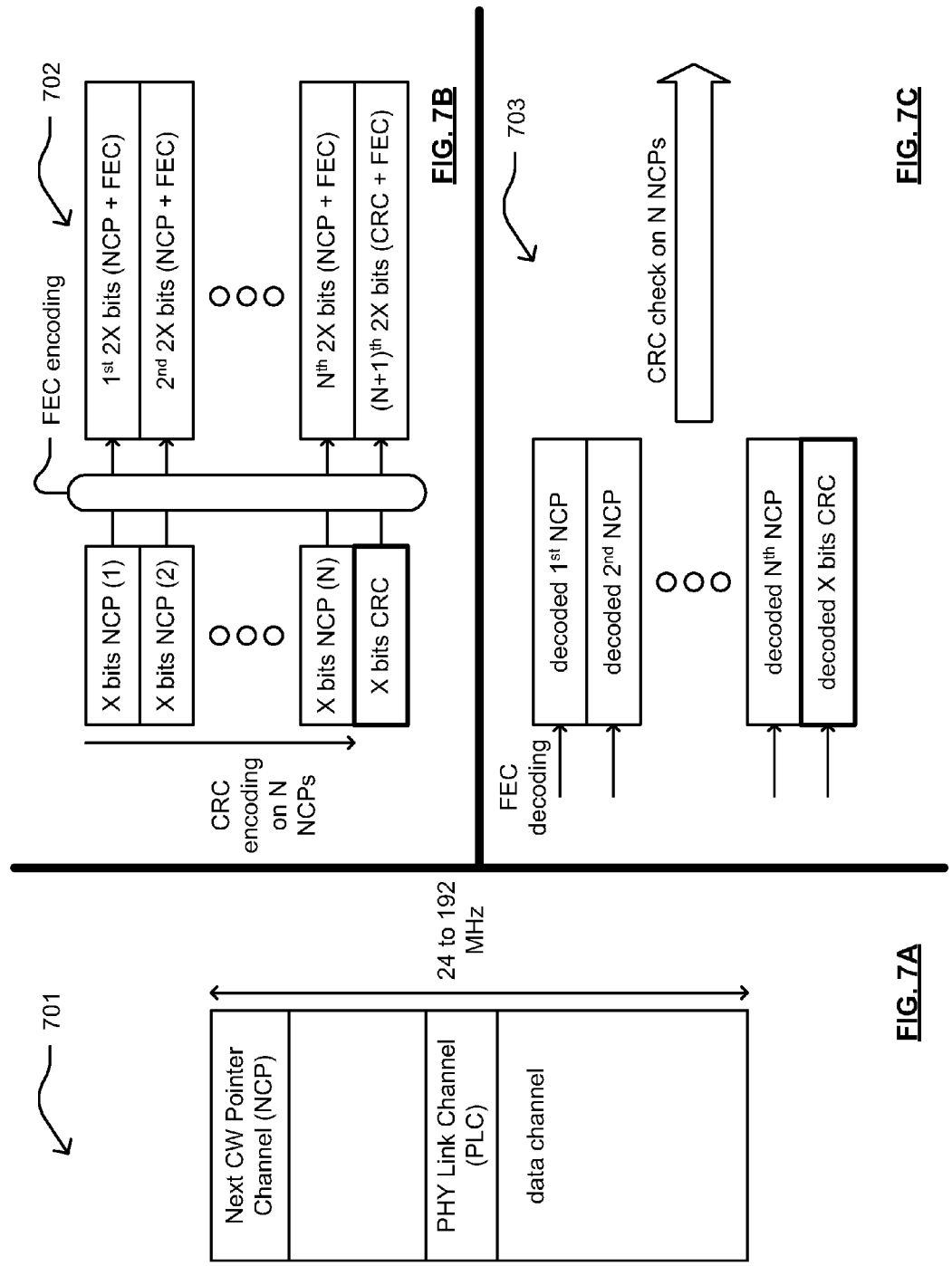

801 →

Mother LDPC code: rate 50% or 1/2 (160, 80)

$$H_{5\times 10} = [H_{LHS} \; H_{RHS}]$$

$$H_{LHS} = \begin{bmatrix} 1 & 11 & 10 & 12 & 7 \\ 2 & 1 & 14 & 15 & 14 \\ 0 & 9 & 3 & 2 & -1 \\ 6 & 8 & -1 & 10 & 3 \\ 12 & 13 & 11 & -1 & 0 \end{bmatrix}$$

$$H_{RHS} = \begin{bmatrix} 9 & -1 & -1 & -1 & -1 \\ 12 & 12 & -1 & -1 & -1 \\ -1 & 11 & 7 & -1 & -1 \\ -1 & -1 & 10 & 4 & -1 \\ -1 & -1 & -1 & 5 & 2 \end{bmatrix}$$

Mother LDPC code: rate 60% or 6/10 (480, 288)

$$H_{4\times 10} = [H_{LHS} \; H_{RHS}]$$

$$H_{LHS} = \begin{bmatrix} 16 & 1 & 28 & 9 & 40 & 38 \\ 28 & 42 & 36 & 11 & 39 & 9 \\ 5 & 2 & 18 & 16 & 25 & 47 \\ 18 & 18 & 40 & 18 & 0 & 34 \end{bmatrix}$$

$$H_{RHS} = \begin{bmatrix} -1 & -1 & -1 & 32 \\ -1 & -1 & 19 & 7 \\ -1 & 38 & 2 & -1 \\ 16 & 8 & -1 & -1 \end{bmatrix}$$

FIG. 8B

VERY SHORT SIZE LDPC CODING FOR PHYSICAL AND/OR CONTROL CHANNEL SIGNALING

CROSS REFERENCE TO RELATED PATENTS/PATENT APPLICATIONS

Provisional Priority Claims

The present U.S. Utility Patent Application claims priority pursuant to 35 U.S.C. §119(e) to the following U.S. Provisional Patent Applications which are hereby incorporated herein by reference in their entirety and made part of the present U.S. Utility Patent Application for all purposes:

1. U.S. Provisional Patent Application Ser. No. 61/753, 267, entitled "Very short size low density parity check (LDPC) codes for physical channel and/or control channel signaling within wired and/or wireless communication systems," filed Jan. 16, 2013.

2. U.S. Provisional Patent Application Ser. No. 61/768, 035, entitled "Very short size low density parity check (LDPC) codes for physical channel and/or control channel signaling within wired and/or wireless communication systems," filed Feb. 22, 2013.

3. U.S. Provisional Patent Application Ser. No. 61/809, 647, entitled "Very short size low density parity check (LDPC) codes for physical channel and/or control channel signaling within wired and/or wireless communication systems," filed Apr. 8, 2013.

4. U.S. Provisional Patent Application Ser. No. 61/820, 651, entitled "Very short size low density parity check (LDPC) codes for physical channel and/or control channel signaling within wired and/or wireless communication systems," filed May 7, 2013.

5. U.S. Provisional Patent Application Ser. No. 61/822, 871, entitled "Very short size low density parity check (LDPC) codes for physical channel and/or control channel signaling within wired and/or wireless communication systems," filed May 13, 2013.

6. U.S. Provisional Patent Application Ser. No. 61/825, 322, entitled "Very short size low density parity check (LDPC) codes for physical channel and/or control channel signaling within wired and/or wireless communication systems," filed May 20, 2013.

7. U.S. Provisional Patent Application Ser. No. 61/834, 825, entitled "Upstream fine ranging within communication systems," filed Jun. 13, 2013.

8. U.S. Provisional Patent Application Ser. No. 61/886, 136, entitled "Very short size LDPC coding for physical and/or control channel signaling," filed Oct. 3, 2013.

BACKGROUND

1. Technical Field

The present disclosure relates generally to communication systems; and, more particularly, to forward error correction (FEC) and/or error correction code (ECC) coding within such communication systems.

2. Description of Related Art

Data communication systems have been under continual development for many years. The primary goal within such communication systems is to transmit information successfully between devices. Unfortunately, many things can deleteriously affect signals transmitted within such systems resulting in degradation of or even complete failure of communication. Examples of such adverse effects include interference and noise that may be caused by a variety of sources including other communications, low-quality communication links, degraded or corrupted interfaces and connectors, etc.

Some communication systems use forward error correction (FEC) coding or error correction code (ECC) coding to increase the amount of information that may be transmitted between devices. When a signaling incurs one or more errors during transmission, a receiver device can employ the FEC or ECC coding to try to correct those one or more errors.

A continual and primary directive in this area of development has been to try continually to lower the SNR required to achieve a given bit error rate (BER) or symbol error rate (SER) within a communication system. The ideal goal has been to try to reach Shannon's limit in a communication channel. Shannon's limit may be viewed as being the data rate to be used in a communication channel, having a particular signal to noise ratio (SNR), which achieves error free transmission through the communication channel. The Shannon limit is the theoretical bound for channel capacity for a given modulation and code rate.

Within the context of communication systems that employ one or more types of FEC or ECC coding, there continues to be much room for improvement related to better designed codes that provide for better performance (e.g., lower BER or SER for a given signal to noise ratio (SNR)). Also, a given application may operate more effectively with FEC or ECC coding particularly tailored for that application. One FEC or ECC code may be more effective or efficient in one application as compared to another.

BRIEF DESCRIPTION OF THE SEVERAL VIEWS OF THE DRAWINGS

FIG. 5A is a diagram illustrating an example of an LDPC matrix partitioned into a left hand side matrix and a right hand side matrix.

FIG. 5B is a diagram illustrating some examples of right hand side matrices of LDPC matrices.

FIG. 6A is a diagram illustrating an example of a communication device configured to perform LDPC encoding and puncturing.

FIG. 6B is a diagram illustrating an example of a communication device configured to perform bit filling, LDPC encoding, shortening, and puncturing.

FIG. 6C is a diagram illustrating an example of various types of ranging.

FIG. 7A is a diagram illustrating an example of an orthogonal frequency division multiplexing (OFDM) channel with physical layer (PHY) Link Channel (PLC).

FIG. 7B is a diagram illustrating an example of cyclic redundancy check (CRC) encoding combined with forward error correction (FEC) encoding.

FIG. 7C is a diagram illustrating an example of CRC check decoding after FEC decoding.

FIG. 8A is a diagram illustrating an example of an LDPC matrix of an LDPC code.

FIG. 8B is a diagram illustrating another example of another LDPC matrix of another LDPC code.

DETAILED DESCRIPTION

Figure 1:
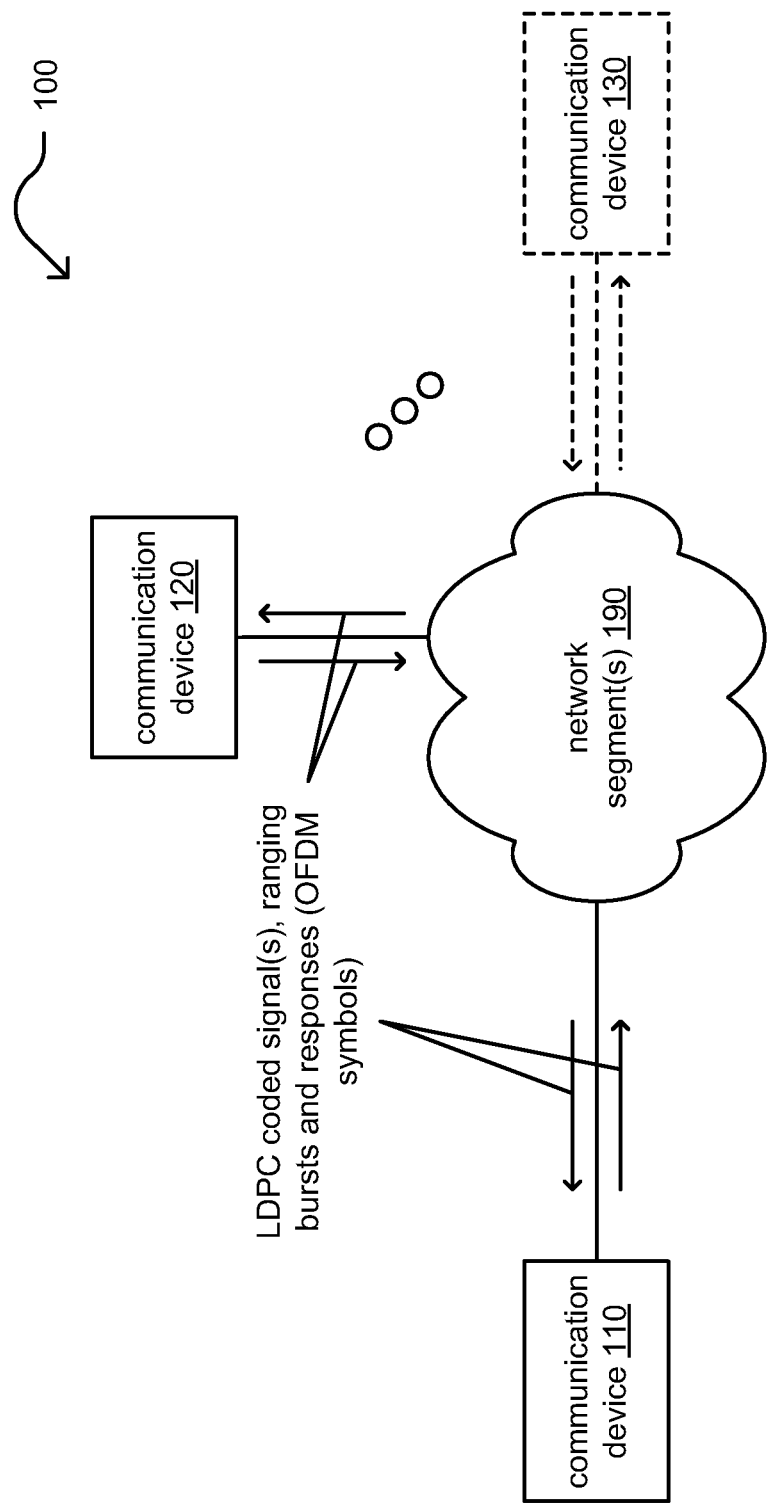
FIG. 1 is a diagram illustrating an embodiment of one or more communication systems.

FIG. 1 is a diagram illustrating an embodiment 100 of one or more communication systems. One or more network segments 190 provide communication inter-connectivity for at least two communication devices 110 and 120. Generally speaking, any desired number of communication devices is included within one or more communication systems (e.g., as shown by communication device 130). Some or all the various communication devices 110-130 include capability to operate using forward error correction (FEC) and/or error correction code (ECC) as described herein.

The various communication links within the one or more network segments 190 may be implemented using any of a variety of communication media including communication links implemented as wireless, wired, optical, satellite, microwave, etc. communication links. Also, in some instances, communication links of different types may cooperatively form a connection pathway between any two communication devices. Considering one example, a communication pathway between devices 110 and 120 may include some segments of wired communication links and other segments of optical communication links. Note also that the devices 110-130 may be of a variety of types of devices including stationary devices, mobile devices, portable devices, etc. and may support communications for any of a number of services or service flows including data, telephony, television, Internet, media, synchronization, etc.

In an example of operation, device 110 includes a communication interface to support communications with one or more of the other devices 120-130. This communication may be bidirectional/to and from the one or more of the other devices 120-130 or unidirectional (or primarily unidirectional) to or from the one or more of the other devices 120-130.

The device 110 may be configured to receive a low density parity check (LDPC) coded signal from one of the other devices 120-130. The device 110 can include a communication interface to perform appropriate demodulation of the received signal (e.g., digital sampling, frequency conversion such as down-conversion, gain adjustment or scaling, etc.) to generate a digital signal, such as a baseband signal, that may undergoes decoding within a processor of the device 110 to generate one or more estimates of one or more bits encoded within the LDPC coded signal.

Also, the device 110 may be configured to generate an LDPC coded signal for transmission to one or more of the other devices 120-130. A processor of the device 110 can perform LDPC and coding of one or more information bit to generate LDPC coded bits and/or one or more LDPC codewords. The communication interface of the device 110 can then generate a continuous time signal based on the LDPC coded bits and/or one or more LDPC codewords and transmit that continuous time signal to one or more of the other devices 120-130.

The LDPC coded signal may be based on an LDPC matrix having a predetermined or known form. For example, the LDPC matrix may be constructed to include a number of sub-matrices. In addition, the LDPC matrix may be arranged in a left hand side matrix and a right hand side matrix. The right hand side matrix can be lower triangular such that all of the sub-matrices therein are all-zero-valued sub-matrices (e.g., all of the elements within an all-zero-valued sub-matrix have the value of "0") except for those sub-matrices located on a main diagonal of the right hand side matrix and another diagonal that is adjacently located to the left of the main diagonal. Those sub-matrices located on the main diagonal and this other diagonal may be CSI (Cyclic Shifted Identity) sub-matrices. The respective sub-matrices located on these two diagonals may be based on different cyclic shift values. Some examples of such a right hand side matrix are described below with reference to FIG. 5B.

Note also that different LDPC codes having different LDPC matrices may be employed to generate different LDPC coded signals. The device 110 may operate using a first LDPC code with a first LDPC matrix at one time, and a second LDPC code with a second LDPC matrix at another time, etc. Generally, the device 110 may perform encoding and/or decoding using different LDPC codes at different times.

Figure 2:
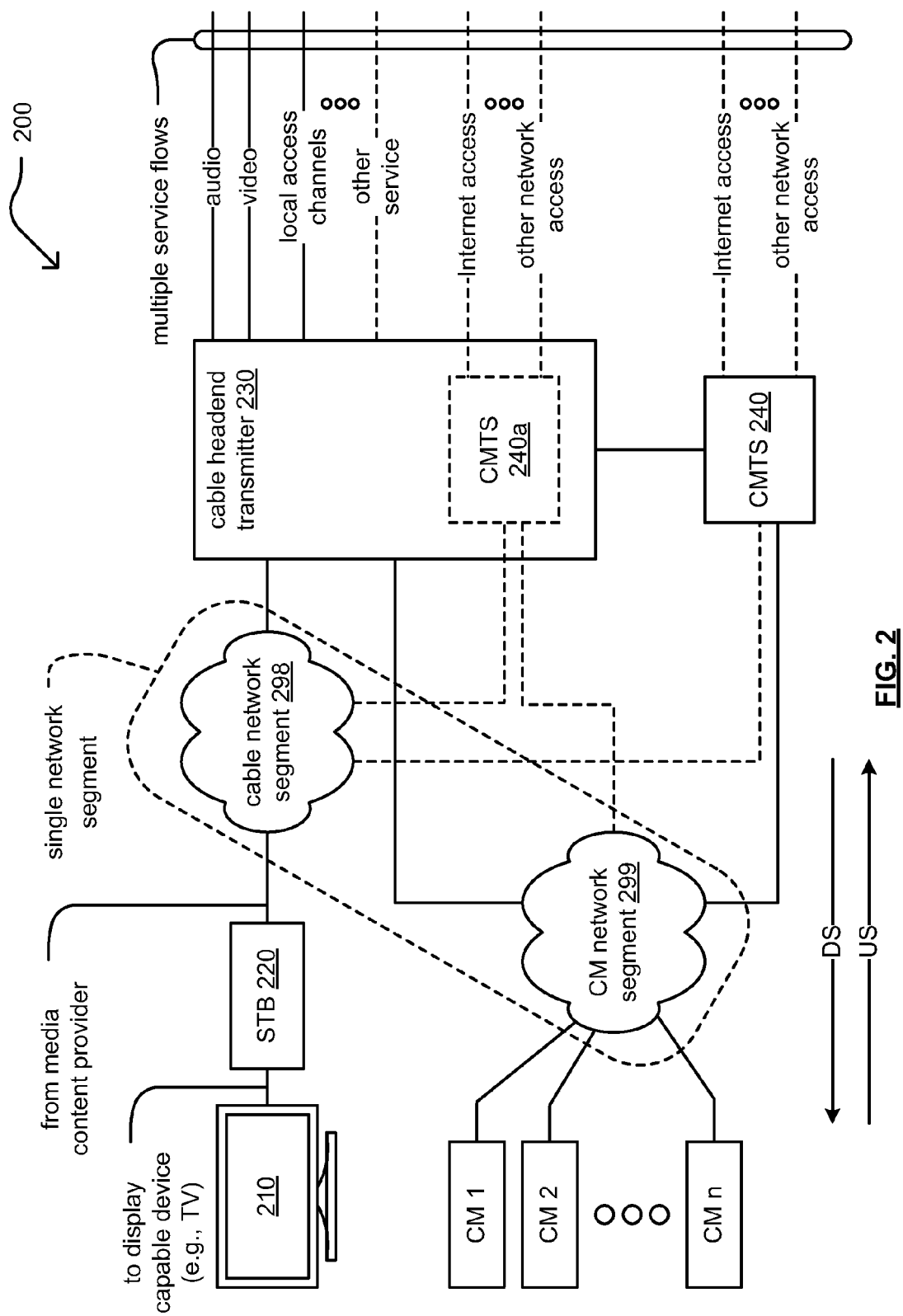
FIG. 2 is a diagram illustrating another embodiment of one or more communication systems.

FIG. 2 is a diagram illustrating another embodiment 200 of one or more communication systems. A cable headend transmitter 230 provides service to a set-top box (STB) 220 via cable network segment 298. The STB 220 provides output to a display capable device 210. The cable headend transmitter 230 can support any of a number of service flows such as audio, video, local access channels, as well as any other service of cable systems. For example, the cable headend transmitter 230 can provide media (e.g., video and/or audio) to the display capable device.

The cable headend transmitter 230 may provide operation of a cable modem termination system (CMTS) 240a. For example, the cable headend transmitter 230 may perform such CMTS functionality, or a CMTS may be implemented separately from the cable headend transmitter 230 (e.g., as shown by reference numeral 240). The CMTS 240 can provide network service (e.g., Internet, other network access, etc.) to any number of cable modems (shown as CM 1, CM 2, and up to CM n) via a cable modem (CM) network segment 299. The cable network segment 298 and the CM network segment 299 may be part of a common network or common networks. The cable modem network segment 299 couples the cable modems 1-n to the CMTS (shown as 240 or 240a). Such a cable system (e.g., cable network segment 298 and/or CM network segment 299) may generally be referred to as a cable plant and may be implemented, at least in part, as a hybrid fiber-coaxial (HFC) network (e.g., including various wired and/or optical fiber communication segments, light sources, light or photo detection complements, etc.).

A CMTS 240 (or 240a) is a component that exchanges digital signals with cable modems 1-n on the cable modem network segment 299. Each of the cable modems is coupled to the cable modem network segment 299, and a number of elements may be included within the cable modem network segment 299. For example, routers, splitters, couplers, relays, and amplifiers may be contained within the cable modem network segment 299. Generally speaking, downstream information may be viewed as that which flows from the CMTS 240 to the connected cable modems (e.g., CM 1, CM 2, etc.), and upstream information as that which flows from the cable modems to the CMTS 240.

At least some of the devices within this diagram are implemented to perform encoding and/or decoding of LDPC coded signals. For example, the CMTS 240 (or 240a) and/or any one or more of the cable modems 1-n may generate/encode and transmit or receive and process/decode LDPC coded signals to other devices within the system.

An LDPC code employed by one or more of the devices within the system may be based on an LDPC matrix that is constructed using a number of sub-matrices and that is arranged in a left hand side matrix and the right hand side matrix. The right hand side matrix can be lower triangular such that all of the sub-matrices therein are all-zero-valued sub-matrices (e.g., all of the elements within an all-zero-valued sub-matrix have the value of "0") except for those sub-matrices located on a main diagonal of the right hand side matrix and another diagonal that is adjacently located to the left of the main diagonal, which are respective CSI sub-matrices (e.g., such a right hand side matrix is described below with reference to FIG. 5B).

Figure 3:
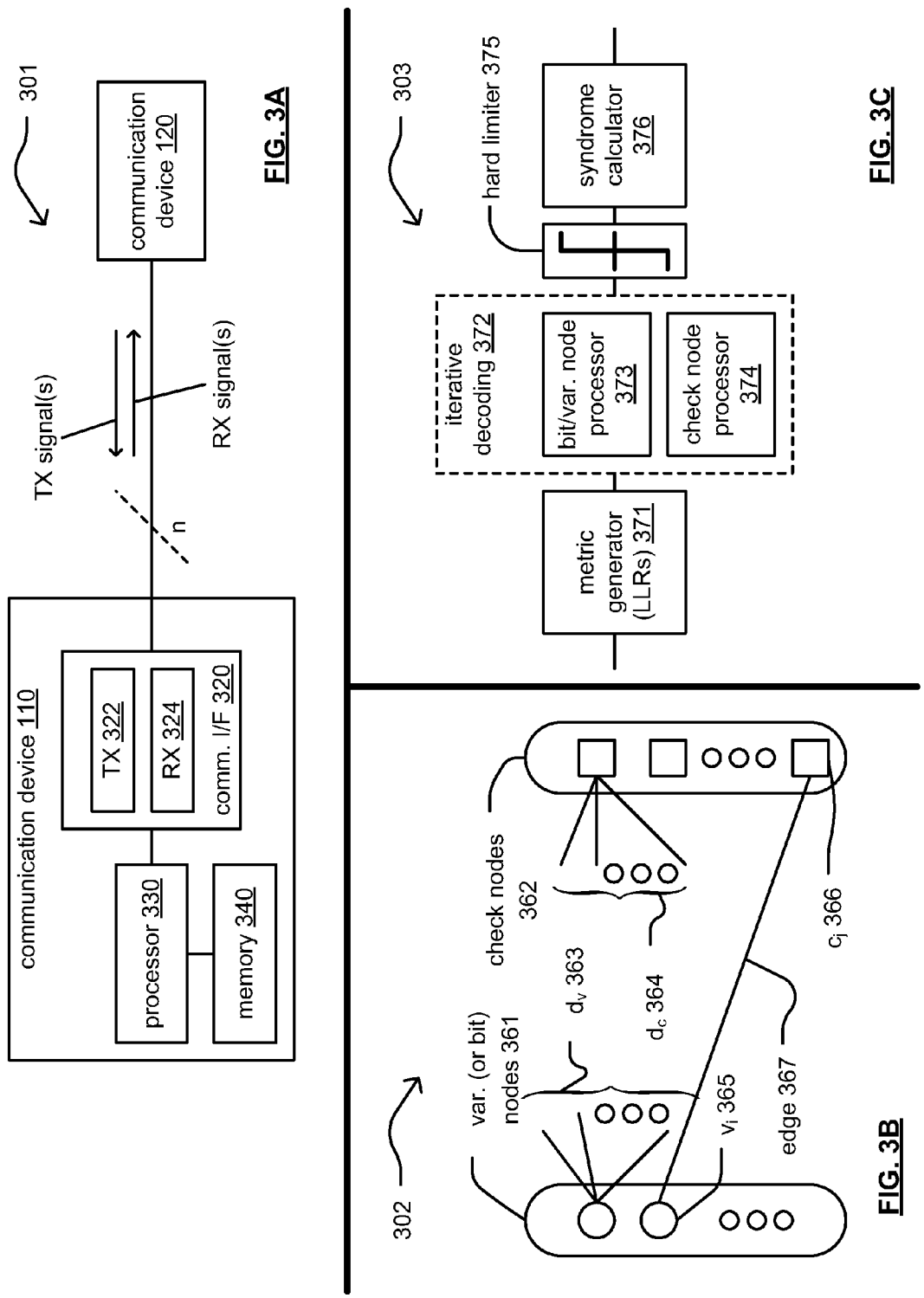
FIG. 3A is a diagram illustrating a communication device operative within one or more communication systems.
FIG. 3B illustrates an example of an LDPC (Low Density Parity Check) code bipartite graph.
FIG. 3C illustrates an example of decoding of an LDPC coded signal.

FIG. 3A is a diagram 301 illustrating a communication device 110 operative within one or more communication systems. The device 110 includes a communication interface 320 and a processor 330. The communication interface 320 includes functionality of a transmitter 322 and a receiver 324 to support communications with one or more other devices (e.g., device 120) within a communication system. The device 110 may also include memory 340 to store information including any information generated by the device 110 to perform such operations as encoding and/or decoding of LDPC coded signals. In a reception mode of operation, The communication interface 320 may be configured to perform appropriate demodulation of received signal (e.g., a continuous-time signal) to generate another signal (e.g., a digital signal, such as a baseband signal), and the processor 330 may be configured to generate one or more estimates of one or more bits encoded within the received signal using an LDPC matrix as described herein. Also, in a transmission mode of operation, the processor 330 may be configured to process one or more bits (such as information bits) to generate an LDPC coded signal, and the communication interface 320 may be configured to perform appropriate modulation of the such an LDPC coded signal to generate and transmit another signal (e.g., a continuous-time signal) to another communication device.

The memory 340 may also store signals and/or information received from other devices via one or more communication channels. Memory 340 may also include and store various operational instructions for use by the processor 330 in regards to encoding and/or decoding of LDPC coded signals as described herein (e.g., including signals that are LDPC coded signals). The communication interface 320 is configured to support communications to and/or and from one or more other devices.

FIG. 3B illustrates an example 302 of an LDPC (Low Density Parity Check) code bipartite graph. An LDPC bipartite graph is sometimes be referred to as a "Tanner" graph. An LDPC bipartite graph is a pictorial representation of an LDPC matrix of a corresponding LDPC code, and it shows the relationship of non-null elements of the LDPC matrix in terms of performs bit or variable edge message updating (based on columns of the LDPC matrix) and check message updating (based on rows of the LDPC matrix). An LDPC code is characterized by a binary parity check matrix (i.e., LDPC matrix) that is sparse, such that nearly all of the elements of the matrix have values of zero ("0"). For example, H= $(H_{i,j})_{M \times N}$ is a parity check matrix of an LDPC code with block length N. The LDPC bipartite graph, or "Tanner" graph, is a pictorial illustration of an LDPC matrix.

LDPC codes are linear block codes and hence the set of all codewords x∈C spans the null space of a parity check matrix, H, as follows:

$$Hx^T=0, \forall x \in C \quad (1)$$

For an LDPC code, the matrix, H, is a sparse binary matrix of dimension m×n. Each row of H corresponds to a parity check and a set element $h_{ij}$ indicates that data symbol j used for the parity check i. Each column of H corresponds to a codeword symbol.

For each codeword x, there are n symbols of which m are parity symbols. Hence the code rate of the LDPC code, r, is provided as follows:

$$r=(n-m)/n \quad (2)$$

The row and column weights are defined as the number of set elements in a given row or column of H, respectively. The set elements of H are chosen to satisfy the performance requirements of the code. The number of 1's in the i-th column of the parity check matrix, H, may be denoted as $d_v(i)$, and the number of 1's in the j-th row of the parity check matrix may be denoted as $d_c(j)$. If $d_v(i)=d_v$ for all i, and $d_c(j)=d_c$ for all j, then the LDPC code is called a ($d_v$, $d_c$) regular LDPC code, otherwise the LDPC code is called an irregular LDPC code.

A regular LDPC code can be represented as a bipartite graph 302 by its parity check matrix with left side nodes representing variable of the code bits (or alternatively as the "variable nodes" (or "bit nodes") 361 in a bit-based decoding of LDPC coded signals), and the right side nodes representing check equations (or alternatively as the "check nodes" 362). The bipartite graph 302 (or Tanner graph 302) of the LDPC code defined by H may be defined by N variable nodes (e.g., N bit nodes) and M check nodes. Every variable node of the N variable nodes 361 has exactly $d_v(i)$ edges. An example edge shown using reference numeral 367 connects the bit node, $v_i$ 365, to one or more of the check nodes (within the M check nodes). The edge 367 is specifically shown as connecting from the bit node, $v_i$ 365, to the check node, $c_j$ 366. This number of $d_v$ edges (shown as 363) may be referred to as the degree of a variable node i. Analogously, a check node of the M check nodes 362 has $d_c(j)$ edges (shown as $d_c$ 364) connecting this node to one or more of the variable nodes (or bit nodes) 361. This number of edges, $d_c$ 364, may be referred to as the degree of the check node j.

An edge 367 between a variable node $v_i$ (or bit node $b_i$) 365 and check node $c_j$ 366 can be defined by e=(i, j). Alternatively, given an edge e=(i, j), the nodes of the edge may alternatively be denoted as by e=(v(e),c(e)) (or e=c(e))). The edges in the graph correspond to the set elements of H where a set element $h_{ji}$ indicates that an edge connects a bit (e.g., variable) node i with parity check node j.

Given a variable node $v_i$ (or bit node $b_i$), one may define the set of edges emitting from the node $v_i$ (or bit node $b_i$) by $E_v=\{e|v(e)=i\}$ (or by $E_b(i)=\{e|b(e)=i\}$); these edges are referred to as bit edges, and the messages corresponding to these bit edges are referred to as bit edge messages.

Given a check node one may define the set of edges emitting from the node $c_j$ by $E_c(j)=\{e|c(e)=j\}$; these edges are referred to as check edges, and the messages corresponding to these check edges are referred to as check edge messages. Continuing on, the derivative result will be $|E_v(i)|=d_v$ (or $|E_b(i)|=d_b$) and $|E_c(j)|=d_c$.

Generally speaking, any such codes (e.g., LDPC codes) that can be represented by a bipartite graph may be characterized as a graph code. It is also noted that an irregular LDPC code may also be described using a bipartite graph. However, the degree of each set of nodes within an irregular LDPC code may be chosen according to some distribution. Therefore, for two different variable nodes, $v_{i_1}$ and $v_{i_2}$, of an irregular LDPC code, $|E_v(i_1)|$ may not be equal to $|E_v(i_2)|$. This relationship may also hold true for more than one (e.g., two) check nodes.

Note that terminology such as that of "bit node" and "bit edge message", or equivalents thereof, may be used on the in the art of LDPC decoding. With respect to LDPC decoding, note that "bit node" and "bit edge message" are alternatively referred to as "variable node" and "variable edge message", respectively. Note that LDPC decoding operates to make one or more estimates of the bit values (or variable values) encoded within an LDPC coded signal.

FIG. 3C illustrates an example 303 of decoding of an LDPC coded signal. Within a communication device (e.g., communication device 110), a signal received from a communication channel undergoes appropriate demodulation (e.g., processing within an analog front end including digital sampling, filtering, gain adjustment, etc.) to generate a received bit sequence. Then, a metric generator 371 calculates log-likelihood ratios (LLRs) for each bit location within the received bit sequence. These LLRs correspond initially to the bit nodes 361 of the LDPC code and its corresponding LDPC bipartite graph 302 that represents the LDPC matrix used to decode the signal.

In one implementation of LDPC decoding, during initialization, the LLRs are employed for the bit edge messages (e.g., extrinsic information) of the edges extending from the respective bit/variable nodes. Thereafter, one or more decoding cycles or iterations may be performed based on check node processing and bit node processing (iterative decoding 372). Check node processing or check node updating is performed using the original bit edge messages (e.g., the calculated LLRs) such as by a check node processor 374. A bit/variable node processor 373 then uses these updated check edge messages to perform bit node processing or bit node updating to update the variable node soft information for use in the next decoding iteration. The most recently updated variable bit/node soft information is then used to calculate the variable node edge messages (extrinsic information) for this next decoding iteration. The check node processor 374 is configured to perform check message updating (based on rows of the LDPC matrix) to generate updated check edge messages, and the bit/variable node processor 373 is configured to perform bit or variable edge message updating (based on columns of the LDPC matrix) as also described with reference to FIG. 3B.

When more than one decoding iteration is performed, these variable node edge messages are then used in by the check node processor 374 for subsequent check node processing or check node updating to calculate updated check edge messages. Then, the bit/variable node processor 373 uses the most recently updated check edge messages to perform bit node processing or bit node updating to update the variable node soft information once again.

After a final decoding iteration, which may be determined based on some parameter (e.g., a predetermined number of decoding iterations or when all syndromes of the LDPC code equal zero, as determined by a syndrome calculator 376), the last calculated variable node soft information may undergo hard limiting (e.g., in a slicer or hard limiter 375) to generate one or more estimates of one or more bits encoded within the LDPC coded signal.

Generally speaking, this approach for decoding of LDPC coded signals may be referred to as a message passing approach (or iterative message passing approach). Note that LDPC decoding may be performed in any of a variety of architectures including parallel decoding architectures, layer decoding architectures etc. The device 110 may be implemented to perform encoding and/or decoding of LDPC coded signal using any desired approach or architecture.

Note that the various functional blocks and components depicted in FIG. 3C may be implemented or performed by the processor 330 (and memory 340) of communication device 110. For example, the processor 330 can be implemented to perform such decoding operations and the memory 340 can be implemented to store and perform memory management for the various bit/variable and check edge messages, variable bit/node soft information, extrinsic information, etc. used in the decoding operations.

Figure 4:
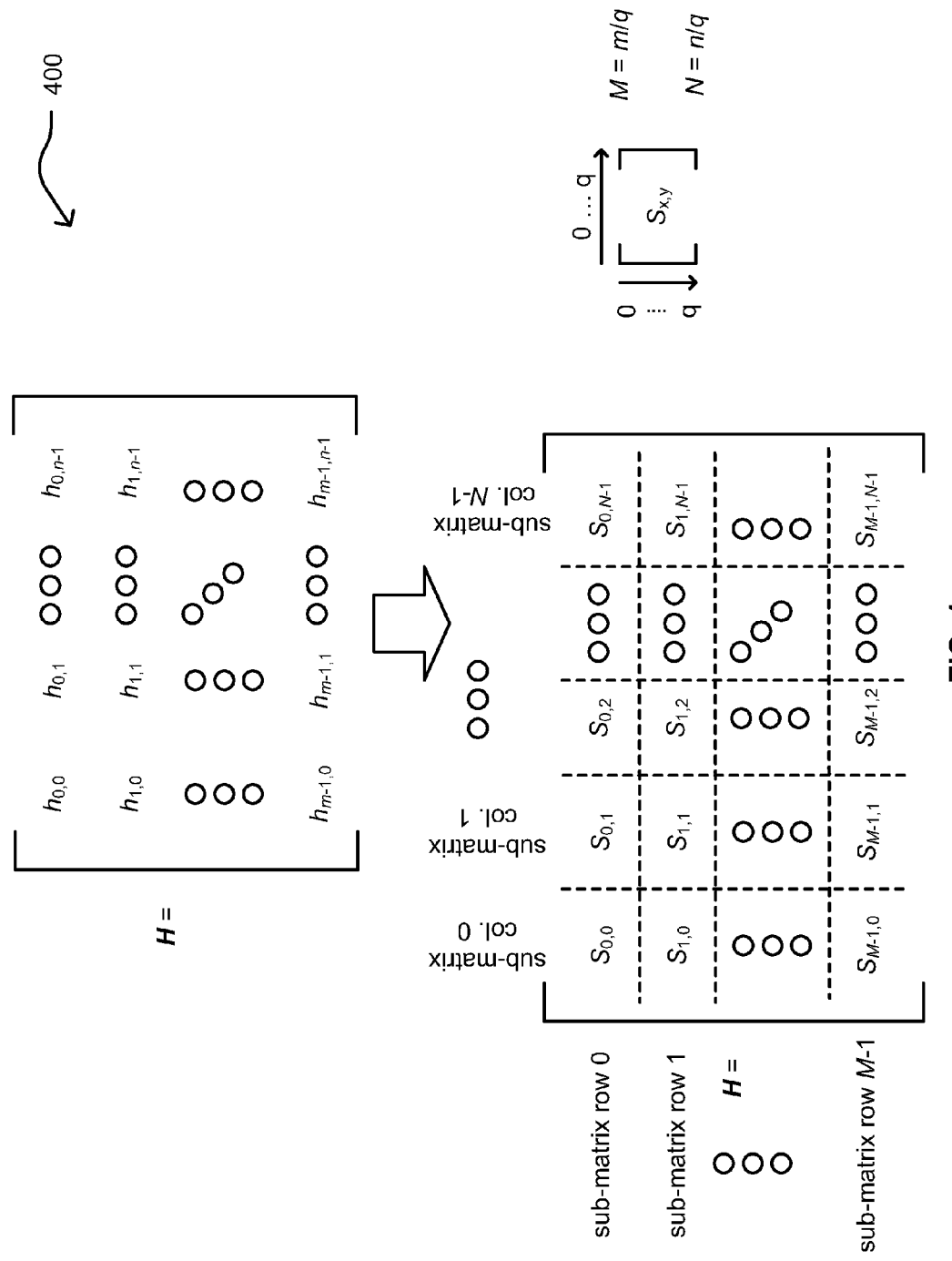
FIG. 4 illustrates an example of an LDPC matrix that is partitioned into sub-matrices.

FIG. 4 illustrates an example 400 of an LDPC matrix that is partitioned into sub-matrices. This diagram shows the relationship between an overall LDPC matrix and the individual sub-matrices therein that can be all zero-valued sub-matrices and/or CSI (Cyclic Shifted Identity) sub-matrices, and the diagram shows the sub-matrix rows and sub-matrix columns of the LDPC matrix that correspond to the sub-matrix arrangement of the LDPC matrix. Note also that a generator matrix, corresponding to an LDPC matrix, may be employed to encode at least one information bit to generate a plurality of LDPC coded bits and/or an LDPC codeword (e.g., such as using back-substitution described below). A generator matrix, G, of an LDPC code has the following relationship with LDPC matrix, H: $GH^T=0$. An LDPC code may be defined or characterized by its LDPC matrix, H, and/or its generator matrix, G.

A binary LDPC code may be fully described by its parity check matrix (i.e., its LDPC matrix). At the top of the diagram, the individual elements of an LDPC matrix, H, are shown:

$$H = \begin{bmatrix} h_{0,0} & h_{0,1} & \ldots & h_{0,n-1} \\ h_{1,0} & h_{1,1} & \ldots & h_{1,n-1} \\ \ldots & \ldots & \ldots & \ldots \\ h_{m-1,0} & h_{m-1,1} & \ldots & h_{m-1,n-1} \end{bmatrix}$$

where n is the number of bits in a codeword, m is the number of parity check equations of the LDPC code, and $h_{i,j}$ is either 0 or 1. An n-bit vector c (e.g., $c=(C_1, C_2, \ldots, C_N)$) is a codeword (i.e., of the LDPC code) if and only if $Hc^T=0$.

For such an LDPC code, the parity matrix H is also composed of a number of q-by-q (i.e., q×q) square sub-matrices as shown in the bottom portion of the diagram and also below:

$$H = \begin{bmatrix} S_{0,0} & S_{0,1} & \ldots & S_{0,N-1} \\ S_{1,0} & S_{1,1} & \ldots & S_{1,N-1} \\ \ldots & \ldots & \ldots & \ldots \\ S_{M-1,0} & S_{M-1,1} & \ldots & S_{M-1,N-1} \end{bmatrix}$$

where M=m/q, N=n/q, and each sub-matrix, $S_{I,J}$ thereof is a q-by-q sub-matrix that is either an all-zero-valued sub-matrix (i.e., in which all elements thereof are the value of zero "0", which is depicted by a blank or an empty sub-matrix or a sub-matrix with value of "−1" therein in the associated diagrams) or a CSI (Cyclic Shifted Identity) sub-matrix. A CSI sub-matrix S is characterized by a shift-value, λ(S), such that the components of S are defined as follows:

$$s_{i,j} = \begin{cases} 1 & \text{if } i + \lambda(S) = j \pmod{q} \\ 0 & \text{otherwise} \end{cases}$$

for any i and j, with $0 \leq i < q$ and $0 \leq j < q$. For example, the q-by-q identity matrix is itself a CSI matrix with a shift-value $\lambda(S)=0$ (i.e., a CSI sub-matrix that has undergone a cyclic shift of zero "0").

As can be seen, the LDPC matrix (as depicted in the lower portion of the diagram), includes various sub-matrix rows and sub-matrix columns. These sub-matrix rows and columns are based on the sub-matrix construction of the LDPC matrix (e.g., shown as sub-matrix rows 0 through M−1 and sub-matrix columns 0 through N−1). This disclosure presents various new designs of LDPC codes.

Note also the following with respect to such LDPC code matrix constructions. A given LDPC code may be a QC (quasi-cyclic)-LDPC code. The definition of such an (n, k) QC-LDPC code is provided as follows:
1. (n−k)-by-n parity check matrix H
2. H is expanded from a binary base matrix $H_b$ of size v-by-u
3. The base matrix $H_b$ is expanded by replacing each sub-matrix in the base matrix with a size z permutation matrix, and each 0 with a size z zero matrix. The permutations used are circular right shifts as described above, and the set of permutation sub-matrices contains the size z identity matrix and circular right shifted versions of the identity matrix (i.e., CSI sub-matrices).

Because each permutation matrix is specified by a single circular right shift, the binary base matrix information and permutation replacement information can be combined into a single compact model matrix $H_{bm}$. The model matrix $H_{bm}$ is the same size as the binary base matrix $H_b$, with each binary entry (i,j) of the base matrix $H_b$ replaced to create the model matrix $H_{bm}$. Each 0 in $H_b$ is replaced by a blank or "−1" negative to denote a size z all-zero matrix, and each other sub-matrix in $H_b$ is replaced by a circular shift size $p(i,j) \geq 0$ (e.g., an entry of "−1" indicates an all-zero-valued sub-matrix, and any other entry such as 0, 1, 2, etc. indicates a CSI (Cyclic Shifted Identity) sub-matrix which can be an identity sub-matrix (if entry is 0), a CSI sub-matrix based on a shift-value of 1 (if entry is 1), a CSI sub-matrix based on a shift-value of 2 (if entry is 2), etc. and so on for any desired cyclic shift-value). The model matrix $H_{bm}$ can then be directly expanded to the entire LDPC matrix, H.

FIG. 5A is a diagram illustrating an example 501 of an LDPC matrix partitioned into a left hand side matrix and a right hand side matrix. The parity matrix H of the bottom of FIG. 4 may be partitioned into a left hand side matrix, $H_{LHS}$, and a right hand side matrix, $H_{RHS}$. The partitioning will be in between two sub-matrix columns. This diagram shows the partitioning being between sub-matrix column x−1 and sub-matrix column x. Both the left hand side matrix, $H_{LHS}$, and the right hand side matrix, $H_{RHS}$, include the same number of sub-matrix rows. In one implementation, the right hand side matrix, $H_{RHS}$, is a square matrix that includes a same number of sub-matrix rows and sub-matrix columns (e.g., the right hand side matrix, $H_{RHS}$, may generally be of any size such as z-by-z, where z is any desired number such as 2, 3, 4, 5, 6, 7, etc.).

FIG. 5B is a diagram illustrating some examples 502 of right hand side matrices of LDPC matrices. A right hand side matrix, $H_{RHS}$, having this form is lower triangular and includes all-zero-valued sub-matrices except for CSI (Cyclic Shifted Identity) sub-matrices located on a main diagonal of the right hand side matrix and another diagonal that is adjacently located to the left of the main diagonal. Note that all of the sub-matrices are all-zero-valued sub-matrices (e.g., all elements of such sub-matrices have value of "0") expect the two adjacent diagonals (e.g., the main diagonal and another diagonal that is adjacently located to the left of the main diagonal). Also, note that these sub-matrices on these two adjacent diagonals may be based on different CSI values. A CSI value of zero indicates an identity sub-matrix. A CSI value of 1 indicates an identity sub-matrix that has undergone a cyclic shift by 1. Any desired CSI value may be employed up to the sub-matrix size, z, if considering sub-matrices of size z-by-z. Generally speaking, a CSI value of x indicates an identity sub-matrix that has undergone a cyclic shift by x.

Various examples have been provided herein showing LDPC decoding that may be performed by processor 330. Processor 330 can also be configured to perform encoding of bit(s) to generate LDPC coded bit(s) and/or LDPC codeword(s). Such encoding maybe performed using back-substitution. An LDPC matrix may be partitioned into a left hand side matrix, $H_{LHS}$, and a right hand side matrix, $H_{RHS}$, such as shown in FIG. 5A. The right hand side matrix, $H_{RHS}$, can have the form of any of the right hand side matrices of FIG. 5B, and may be of any desired size such as 3-by-3, 4-by-4, 5-by-5, or generally of any size such as z-by-z, where z is any desired number such as 2, 3, 4, 5, 6, 7, etc.

Considering a right hand side matrix, $H_{RHS}$, having the form of those in FIG. 5B, a CSI sub-matrix may be a respective identity matrix that has either not been cyclic shifted (and remains an identity matrix) or a respective identity matrix that has been cyclic shifted by some amount as described above.

For sub-matrices of size, L-by-L, input (information) bits, $c_{in}$ (k bits=L(n−m) bits), may be represented as follows:

$$c_{in} = (c_0, c_1, \ldots, c_{k-1})$$

The processor 330 then encodes the input (information) bits and computes L·m parity bits, $c_{par}$ (e.g., LDPC coded bits).

$$c_{par} = (c_k, c_{k+1}, \ldots, c_{Ln-1})$$

The processor 330 then outputs the following:

$$c_P^T = \begin{pmatrix} C_0 \\ C_1 \\ C_2 \\ C_3 \\ C_4 \end{pmatrix}, \text{ where}$$

$$C_i = (c_{L(n-m+i)}, c_{L(n-m+i)+1}, \ldots, c_{L(n-m+i)+L-1})^T.$$

For a right hand side matrix, $H_{RHS}$, in the form of those in FIG. 5B being of size 5-by-5 (e.g., where i varies from 0 to 4 in order of 0, 1, 2, 3, 4).

The encoding procedure may be described as follows:

---

Input: $c_I = (c_0, c_1, \ldots, c_{k-1})$
Step 1: compute $V_i = H_{L,i} c_I^T$, such that $i = 0, \ldots, 4$.
Step 2: back-substitution
$C_0 = V_0(L - u_{0,0})$
$C_1 = V_1(L - u_{1,1}) + C_0((L - u_{1,1} + u_{1,0}) \bmod L)$
$C_2 = V_2(L - u_{2,2}) + C_1((L - u_{2,2} + u_{2,1}) \bmod L)$
$C_3 = V_3(L - u_{3,3}) + C_2((L - u_{3,3} + u_{3,2}) \bmod L)$
$C_4 = V_4(L - u_{4,4}) + C_3((L - u_{4,4} + u_{4,3}) \bmod L)$ $$\text{Output: } c_P^T = \begin{pmatrix} C_0 \\ C_1 \\ C_2 \\ C_3 \\ C_4 \end{pmatrix}$$

FIG. 6A is a diagram illustrating an example 601 of a communication device configured to perform LDPC encoding and puncturing. A forward error correction (FEC) encoder 620 processes information bits to generate coded bits. In the context of LDPC encoding, encoder 620 employs a generator matrix that is based on a given LDPC code that may also be characterized by a corresponding LDPC matrix. The LDPC matrix can have the characteristics and forms such as described with reference to FIG. 5B such that all sub-matrices of the LDPC matrix are all-zero-valued sub-matrices with the exception of those sub-matrices on the main diagonal and the other diagonal adjacently located that are CSI sub-matrices.

A puncturer 630 punctures one or more subsets of information bits and one or more subsets of parity bits from the coded bits generated by the FEC encoder 620 to generate one or more codewords. These subsets of information bits and parity bits may be groups of contiguous bits within the coded bits. For example, a first contiguous subset of information bits (e.g., having a first period) may be punctured, and a contiguous subset of parity bits may be punctured (e.g., having the first or a second period). In other examples, more than one contiguous subset may be punctured from the coded bits (e.g., two or more contiguous subsets of information bits may be punctured, and two or more contiguous subsets of parity bits may be punctured). In even other examples, different numbers of subsets of bits may be punctured from the information bits and the parity bits (e.g., one subset of bits punctured from information bits, and to subsets of bits punctured from the parity bits). Such puncturing may be performed using different periods of bits, and/or different starting locations within the coded bits.

A transmit (TX) driver 690 processes the one or more codewords to generate one or more continuous-time signals for transmission to one or more other devices via one or more communication channels. The TX driver 690 may perform operations such as those of an analog front end (AFE) of a communication device (e.g., digital to analog conversion, frequency conversion such as conversion, scaling, filtering, etc.). Generally, the TX driver 690 operates to generate a signal suitable for transmission from the communication device.

FIG. 6B is a diagram illustrating an example 602 of a communication device configured to perform bit filling, LDPC encoding, shortening, and puncturing. The example 602 has some similarity to the example 601 of FIG. 6A with differences being that a bit filler 605 operates to add one or more zero-valued bits to the incoming information bits before encoding by the FEC encoder 620. After FEC encoding, a shortener 625 operates to remove those zero-valued bits that were added to the information bit before undergoing FEC encoding. The other components (620, 630, and 690) in the example 602 generally operate similarly as within example 601 of FIG. 6A.

Note that the operations of the various functional blocks, components, etc. within FIGS. 6A and 6B may be performed within communication device 110. For example, communication interface 320 of device 110 may be configured to perform the operations of the transmit (TX) driver 690. The processor 330 of device 110 may be configured to perform bit filling, LDPC encoding, shortening, puncturing, and/or other related operations.

FIG. 6C is a diagram illustrating an example 603 of various types of ranging. This diagram shows three ranging signals: Initial, Fine, and Wideband.

Initial Ranging (IR) is used by the CMTS to identify a new admitting CM and for coarse power and timing ranging. Fine Ranging (FR) is used for the $2^{nd}$ stage of admission, after Initial Ranging received correctly; Fine Ranging is also used to fine tune timing and power. Wideband Probes (WPs) are used during admission and steady state for pre-equalization configuration and periodic TX power and time shift ranging.

FIG. 7A is a diagram illustrating an example 701 of an orthogonal frequency division multiplexing (OFDM) channel with physical layer (PHY) Link Channel (PLC). The PHY Link Channel (PLC) relative to the OFDM channel is shown in this diagram. The PHY Link Channel (PLC) is located in the downstream convergence layer. It may be used for several tasks.
1. Timestamp.
2. Energy management.
3. Message channel for bringing new cable modems (CMs) on line.
4. Trigger message for synchronizing an event between the CMTS and CM.

The CMTS may be configured to assign a unique PLC to each OFDM channel. If there is more than one OFDM channel, the CM will be directed as to which PLC will be the primary PLC for the CM. When the CM initializes, it first locates a PLC channel. It then acquires just enough configuration information to join a primary downstream profile in the main OFDM channel. From there, it receives further configuration information. Certain preferred radio frequency (RF) parameters and CRC-24-D may be employed (as based on FIG. 7B below).

The Next Codeword Pointer (NCP) channel is used and added to downstream OFDM symbols to point to the codewords being transmitted (e.g., one pointer per codeword). The NCPs and data subcarriers may be time interleaved together, and one OFDM symbol may incorporate more than one NCP (e.g., several NCPs). The NCP structure can be based on a rate 1/2 (48, 24) LDPC code that includes 24 information bits plus 24 parity bits. A successful decoding of a FEC codeword relies on a proper reception and decoding of its associated NCP. As such, the NCP FEC is designed to provide good immunity against noise (additive white Gaussian noise (AWGN) and burst noise) and should generally have error correction capability at least as good as the FEC used for the data channel. One possible LDPC code suitable for the NCP channel is a punctured LDPC code 50% (48,24) that is structured from a short LDPC code (160,80) as shown with reference to FIG. 8A below. A constellation size of 64 quadrature amplitude modulation (QAM) may be used such that each NCP requires 48 coded bits with 8 tones or sub-carriers.

FIG. 7B is a diagram illustrating an example 702 of cyclic redundancy check (CRC) encoding combined with forward error correction (FEC) encoding. The number of Next Codeword Pointer (NCP) ranges, N, ranges from 1 to 11. A 24 bit CRC is employed (e.g., N×24 information bits) and 24 parity bits. One possible FEC code employed is a rate 1/2 (48, 24) LDPC code (e.g., X in the diagram within equal 24), and other FEC codes may alternatively be used.

This example 702 is shown as operating for the Next Codeword Pointer (NCP) channel. Note, however, similar CRC coding combined with FEC encoding may be performed for other channels. Information bits are partitioned into groups of X bits each to be encoded and transmitted via the NCP channel (e.g., X=24 using a rate 1/2 (48, 24) LDPC code). CRC encoding is performed on a number of these groups of X bits (e.g., consider N groups of X bits to generate a CRC block (e.g., X bits CRC, such as including 24 bits using a 24 bit CRC).

In all, including the CRC block, there are then N+1 blocks that undergo FEC encoding to generate coded blocks. For example, the first block of X bits undergo FEC encoding to generate a first coded block ($1^{st}$ 2X bits (NCP+FEC)), a second block of X bits undergo FEC encoding to generate a second coded block ($2^{nd}$ 2X bits (NCP+FEC)), and so on up to the CRC block undergoing FEC encoding to generate a last/N+$1^{th}$ coded block (2X bits (CRC+FEC)). These various coded blocks then undergo appropriate processing to generate one or more signals for transmission via a communication channel, such as the NCP channel.

FIG. 7C is a diagram illustrating an example 703 of CRC check decoding after FEC decoding. The various coded blocks initially undergo FEC decoding to generate decoded groups of X bits (e.g., $1^{st}$ NCP, $2^{nd}$ NCP, etc.) corresponding to the various groups of X bits shown above and FIG. 7B and the CRC block. After this is complete, a CRC check is performed on all of the N NCPs as well.

The combination of CRC and FEC encoding/decoding may be viewed as being performed in two dimensions such that a CRC block is first generated based on the multiple groups of X bits in a first direction (e.g., vertically in the diagram), and then FEC encoding is performed on the multiple groups of X bits as well as the CRC block in a second direction (e.g., horizontally in the diagram).

In many applications, LDPC codes typically have sizes of beyond 100 bit block lengths. This disclosure presents various ways to perform puncturing or bit filling, shortening, and puncturing in combination with LDPC coding to generate relatively short length codes (e.g., much shorter than 100, and a shortest of 24 bits in at least one instance).

To describe a shortening pattern, three indices are used, as follows:
 (1) Shortening period
 (2) Shortening sizes
 (3) Shortening start position for a period Consider the constructed short LDPC code is an (N, K) code, then there are N positions, namely 0, 1, . . . , N−1. Consider that k information bits will be encoded. A shortening pattern with P periods may denote a shortening size for every period by $s_0, s_1, \ldots, s_{P-1}$, respectively, and the shortening start positions for every period by $n_0, n_1, \ldots, n_{P-1}$. This may be described as follows:

$$\sum_{i=0}^{P-1} s_i = K - k \text{ and } 0 \le n_0 < n_1 < \ldots < n_{P-1} < K - 1.$$

An LDPC encoder can be implemented as follows:

Given k information data bits, after the first $n_0$ information bits pad $s_0$ the receiver known bits, say 0s; then fill more information bits before the position $n_1$; then pad $s_1$ 0's starting at position $n_2$, . . . etc.

LDPC encoding will then generate a codeword as follows: $(c_0, c_1, \ldots, c_{K-1}, c_K, \ldots, c_{N-1})$.

Among the k information bits there are K−k padded or filled 0-valued bits (e.g., bits having value of '0'/zero). The last N−K codeword bits are parity bits, namely, $c_0, c_K, \ldots, c_{N-1}$.

Similar to shortening pattern, puncturing pattern also use 3 sets of indices as follows:
 (1) Puncturing period, say Q
 (2) Puncturing sizes, say $t_0, t_1, \ldots, t_{Q-1}$
 (3) Puncturing start position, say $m_0, m_1, \ldots, m_{Q-1}$ The output bits of the shortening and puncturing encoder can be given as follows:

Step 1: from the codeword $(c_0, c_1, \ldots, c_{K-1}, c_K, \ldots, c_{N-1})$, starting from position $m_i$ delete $t_i$ bits, respectively for i=0, . . . , Q−1.

Step 2: delete all filled or padded bits from LDPC encoder.

Some specific examples are provided below that perform shortening and puncturing on a relatively longer size code to generate a relatively short length code.

FIG. 8A is a diagram illustrating an example 801 of an LDPC matrix of an LDPC code. This LDPC matrix is a short, mother LDPC code (160,80). The sizes of the sub-matrices of the mother LDPC code are 16×16. Also, the right hand side matrix, $H_{RHS}$, of this LDPC mother code has a form similar to those shown in FIG. 5A.

A punctured LDPC code 50% (48,24) may be generated using the architecture of FIG. 6B based on the short, mother LDPC code (160,80). The punctured LDPC code 50% (48, 24) may be used for the NCP channel. For example, a shortening size of 56 may be applied to 24 information bits. With reference to FIG. 6B, 56 consecutive 0-valued bits (e.g., 00 . . . 0) may be filled, starting at position 24, with respect to the information bits (e.g., $a_{23} \ldots a_0$) to generate a sequence of 80 total bits (e.g., 00 . . . 0). The FEC/LDPC encoder 620 then uses the short LDPC code (160,80) to encode the information plus fill bits to generate 160 coded bits (e.g., $b_{159} \ldots b_{80}$ 00 . . . 0$a_{23}$ . . . $a_0$). Then, the shorter 625 removes the 56 0-valued fill bits (e.g., 00 . . . 0) from the 160 coded bits (e.g., $b_{159} \ldots b_{80}$00 . . . 0$a_{23}$ . . . $a_0$). so that only the 24 information bits and the parity bits remain (e.g., $b_{159} \ldots b_{80}a_{23} \ldots a_0$).

The puncturer 630 may then perform puncturing of this sequence (e.g., $b_{159} \ldots b_{80}a_{23} \ldots a_0$) using a period of 3 as follows:
 1. $1^{st}$ period: size 24 and starting position 80.
 2. $2^{nd}$ period: size 16 and starting position 112.
 3. $3^{rd}$ period: size 16 and starting position 144.

This puncturing may be shown as $$\underbrace{xx \ldots x}_{16 \text{ (3rd period)}} b_{143}b_{142} \ldots b_{128} \underbrace{xx \ldots x}_{16 \text{ (2nd period)}}$$

$$b_{111}b_{110} \ldots b_{104} \underbrace{xxx \ldots xa_{23}a_{22}}_{24 \text{ (1st period)}} \ldots a_2a_1a_0.$$

and generates the following sequence or codeword $$\underbrace{b_{143}b_{142} \ldots b_{128}b_{111}b_{110} \ldots b_{104}}_{24} \underbrace{a_{23}a_{22} \ldots a_2a_1a_0}_{24}$$

that may be processed by the TX driver 690 to generate a transmit signal.

Any desired modulation may be employed for the NCP channel including 16 QAM based on 4 bit symbols, 64 QAM based on 6 bit symbols, etc. Orthogonal frequency division multiplexing (OFDM) signaling may be employed such as using 8 bit or 16 bit subcarrier or tone mapping, and NCP related information may be located at the beginning or end of data in a given OFDM symbol.

FIG. 8B is a diagram illustrating another example 802 of another LDPC matrix of another LDPC code. This LDPC matrix is based on a mother LDPC code rate 60% or 6/10 (480,288). The sizes of the sub-matrices of the mother LDPC code are 48×48. Also, the right hand side matrix, $H_{RHS}$, of this LDPC mother code has a form similar to those shown in FIG. 5A.

A punctured LDPC code 3/4 or 75% (384,288) code may be generated using the architecture of FIG. 6A based on the mother LDPC code rate 60% or 6/10 (480,288). The punctured LDPC code 3/4 or 75% (384,288) code may be used for the PLC channel. The mother LDPC code: 60% (480,288) code is a 4×10 base parity check matrix with sub-matrix size (lifting value) equal to 48 (sub-matrices of size 48×48).

The punctured LDPC code 3/4 or 75% (384,288) code is obtained by puncturing (480,288) mother code using two puncturing periods (e.g., Period 1: size 48 start at 48 (puncturing information bits) and Period 2: size 48 start at 384 (puncturing parity bits)).

With reference to FIG. 6A, the FEC/LDPC encoder 620 encodes 288 information bits (e.g., $a_{287} \ldots a_1 a_0$) to generate a coded sequence (e.g., $b_{479} \ldots b_{288} a_{287} \ldots a_1 a_0$).

The puncture 630 operates on the coded sequence (e.g., $b_{479} \ldots b_{288} a_{287} \ldots a_1 a_0$) using the two puncturing periods as follows:

$$b_{479} \ldots b_{432} \underbrace{xx \ldots x}_{48 \text{ (2nd period)}} b_{383} \ldots b_{289} b_{288} a_{287} \ldots a_{97} a_{96} \underbrace{xxx \ldots x}_{48 \text{ (1st period)}} a_{47} \ldots a_1 a_0$$

and generates the following sequence or codeword $$\underbrace{b_{469} \ldots b_{432} b_{383} \ldots b_{288} a_{287} \ldots a_{97}}_{144} \underbrace{a_{96} a_{47} \ldots a_1 a_0}_{240}$$

that may be processed by the TX driver 690 to generate a transmit signal.

Figure 9B:
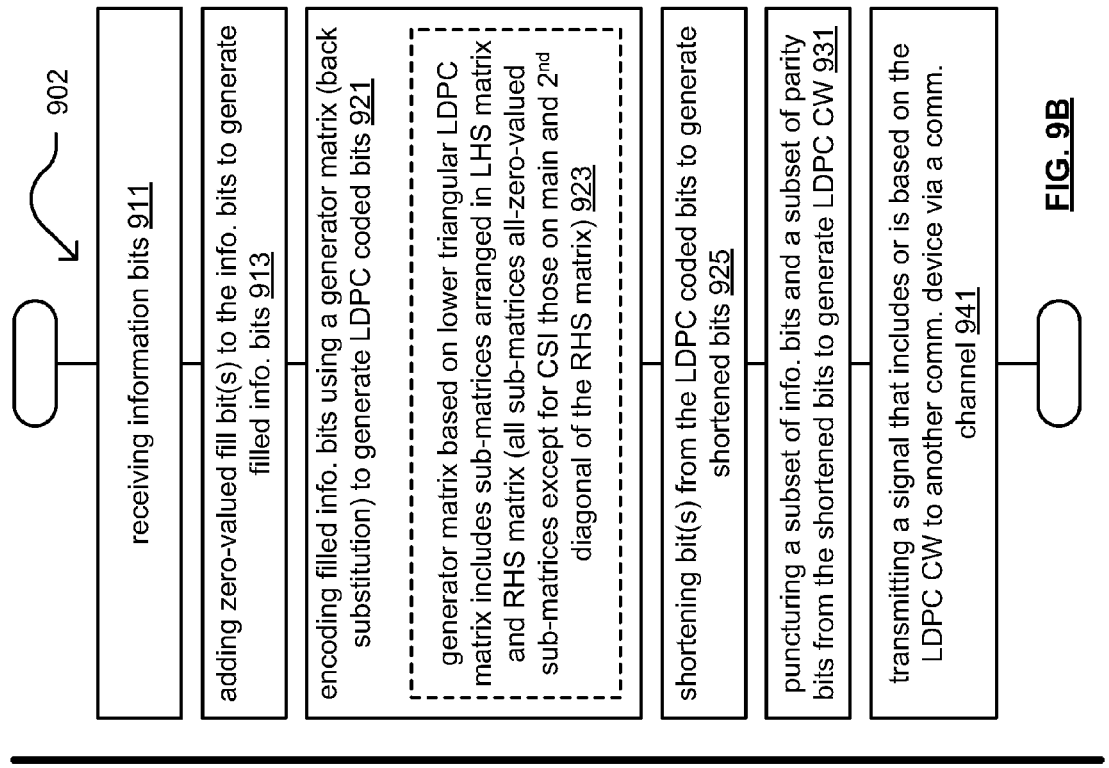
FIG. 9B is a diagram illustrating another embodiment of a method for execution by one or more communication devices.
Figure 9A:
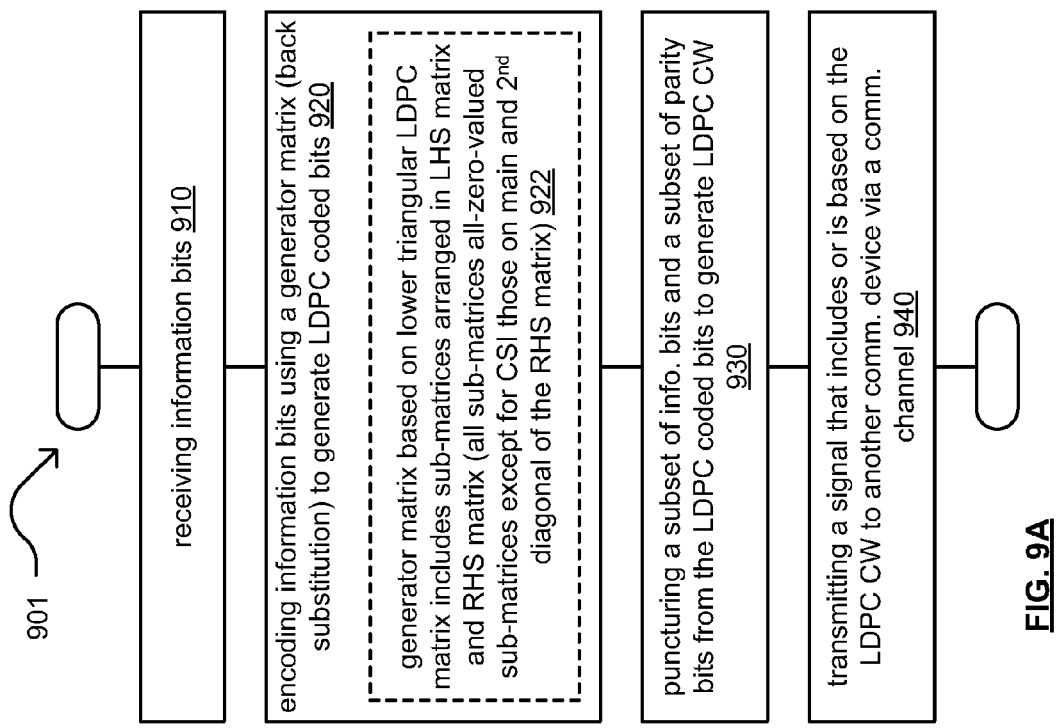
FIG. 9A is a diagram illustrating an embodiment of a method for execution by one or more communication devices.

FIG. 9A is a diagram illustrating an embodiment of a method 901 for execution by one or more communication devices. The method 901 operates by receiving information bits (block 910) and encoding those information bits using a generator matrix of an LDPC code to generate LDPC coded bits (block 920). The LDPC code may be characterized by an LDPC matrix that is lower triangular and includes all-zero-valued sub-matrices except for CSI (Cyclic Shifted Identity) sub-matrices located on a main diagonal of the right hand side matrix and another diagonal that is adjacently located to the left of the main diagonal (block 922).

The method 901 then operates by puncturing a subset of information bits in the subset of parity bits from the LDPC coded bits to generate an LDPC codeword (block 930). Then, the method 901 operates by transmitting a signal that includes or is based on the LDPC codeword to another communication device via a communication channel (block 940).

FIG. 9B is a diagram illustrating another embodiment of a method 902 for execution by one or more communication devices. The method 902 operates by receiving information bits (block 911) and adding one or more zero-valued bits to the information bits to generate filled information bits (block 913). The method 902 operates by encoding the filled information bits using a generator matrix of an LDPC code to generate LDPC coded bits (block 921). The LDPC code may be characterized by an LDPC matrix that is lower triangular and includes all-zero-valued sub-matrices except for CSI (Cyclic Shifted Identity) sub-matrices located on a main diagonal of the right hand side matrix and another diagonal that is adjacently located to the left of the main diagonal (block 923).

The method 902 then operates by shortening the one or more zero-valued bits from the LDPC coded bits to generate shortened bits (block 925). The method 902 continues by puncturing a subset of information bits in the subset of parity bits from the shortened bits to generate an LDPC codeword (block 931). Then, the method 902 operates by transmitting a signal that includes or is based on the LDPC codeword to another communication device via a communication channel (block 941).

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

As may also be used herein, the terms "processing module", "processing circuit", "processor", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

One or more embodiments of an invention have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

The one or more embodiments are used herein to illustrate one or more aspects, one or more features, one or more concepts, and/or one or more examples of the invention. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module includes a processing module, a processor, a functional block, hardware, and/or memory that stores operational instructions for performing one or more functions as may be described herein. Note that, if the module is implemented via hardware, the hardware may operate independently and/or in conjunction with software and/or firmware. As also used herein, a module may contain one or more sub-modules, each of which may be one or more modules.

While particular combinations of various functions and features of the one or more embodiments have been expressly described herein, other combinations of these features and functions are likewise possible. The present disclosure of an invention is not limited by the particular examples disclosed herein and expressly incorporates these other combinations.

What is claimed is:

1. A communication device comprising:
    a communication interface; and
    a processor, at least one of the processor or the communication interface configured to:
        encode information bits using a low density parity check (LDPC) code to generate coded bits, wherein the LDPC code is characterized by an LDPC matrix that includes a plurality of sub-matrices arranged in a left hand side matrix and a right hand side matrix, wherein the right hand side matrix is lower triangular and includes all-zero-valued sub-matrices except for CSI (Cyclic Shifted Identity) sub-matrices located on a main diagonal of the right hand side matrix and another diagonal that is adjacently located to a left of the main diagonal; and
        puncture a subset of the information bits and a subset of parity bits from the coded bits to generate a codeword; and
        transmit a signal that includes the codeword to another communication device via a communication channel.

2. The communication device of claim 1, wherein the at least one of the processor or the communication interface is further configured to:
    add a plurality of zero-valued fill bits to the information bits before encoding using the LDPC code; and
    shorten the plurality of zero-valued fill bits from the coded bits before puncturing the subset of the information bits and the subset of parity bits.

3. The communication device of claim 1, wherein the at least one of the processor or the communication interface is further configured to:
    transmit the signal via a Physical Layer (PHY) Link Control (PLC) sub-channel used for ranging or a Next Codeword Pointer (NCP) sub-channel used for locating at least one additional codeword, wherein the communication channel includes the PLC sub-channel and the NCP sub-channel.

4. The communication device of claim 1, wherein the at least one of the processor or the communication interface is further configured to:
    add a plurality of zero-valued fill bits to other information bits to generate filled bits;

encode the filled bits using another LDPC code to generate other coded bits;

shorten the plurality of zero-valued fill bits from the other coded bits; and puncture a subset of information bits and a subset of parity bits from the other coded bits to generate another codeword;

transmit the signal via a Physical Layer (PHY) Link Control (PLC) sub-channel of the communication channel; and transmit another signal that includes the other codeword to the ether another communication device via a Next Codeword Pointer (NCP) sub-channel of the communication channel.

5. The communication device of claim 1, wherein the at least one of the processor or the communication interface is further configured to:

encode other information bits using an forward error correction (FEC) code to generate data bits; and the communication interface configured to transmit another signal that includes the data bits to the another communication device via a data sub-channel of the communication channel.

6. The communication device of claim 1, wherein the at least one of the processor or the communication interface is further configured to:

generate another codeword;

generate cyclic redundancy check (CRC) bits based on the codeword and the other codeword; and transmit one or more signals that include the codeword, the other codeword, and the CRC bits to the another communication device via the communication channel.

7. The communication device of claim 1 further comprising:

a cable modem, wherein the another communication device is a cable headend transmitter or a cable modem termination system (CMTS).

8. The communication device of claim 1, wherein the at least one of the processor or the communication interface is further configured to:

support communications within at least one of a satellite communication system, a wireless communication system, a wired communication system, a fiber-optic communication system, or a mobile communication system.

9. A communication device comprising:

a communication interface; and a processor, at least one of the processor or the communication interface configured to:

encode first information bits using a first low density parity check (LDPC) code to generate first coded bits;

encode second information bits using a second LDPC code to generate second coded bits, wherein at least one of the first or second LDPC codes is characterized by an LDPC matrix that includes a plurality of sub-matrices arranged in a left hand side matrix and a right hand side matrix, wherein the right hand side matrix is lower triangular and includes all-zero-valued sub-matrices except for CSI (Cyclic Shifted Identity) sub-matrices located on a main diagonal of the right hand side matrix and another diagonal that is adjacently located to a left of the main diagonal; and puncture a first subset of the first information bits and a first subset of parity bits from the first coded bits to generate a first codeword; and puncture a second subset of the second information bits and a second subset of parity bits from the second coded bits to generate a second codeword; and transmit a first signal that includes the first codeword to another communication device via a Physical Layer (PHY) Link Control (PLC) sub-channel of a communication channel; and transmit a second signal that includes the second codeword to the another communication device via a Next Codeword Pointer (NCP) sub-channel of the communication channel.

10. The communication device of claim 9, wherein the at least one of the processor or the communication interface is further configured to:

add a plurality of zero-valued fill bits to the second information bits before encoding using the second LDPC code; and shorten the plurality of zero-valued fill bits from the second coded bits before puncturing the second subset of information bits and the second subset of parity bits.

11. The communication device of claim 9, wherein the at least one of the processor or the communication interface is further configured to:

encode third information bits using an forward error correction (FEC) code to generate data bits; and transmit another signal that includes the data bits to the another communication device via a data sub-channel of the communication channel.

12. The communication device of claim 9 further comprising:

a cable modem, wherein the another communication device is a cable headend transmitter or a cable modem termination system (CMTS).

13. The communication device of claim 9, wherein the at least one of the processor or the communication interface is further configured to:

support communications within at least one of a satellite communication system, a wireless communication system, a wired communication system, a fiber-optic communication system, or a mobile communication system.

14. A method for execution by a communication device, the method comprising:

encoding information bits using a low density parity check (LDPC) code to generate coded bits, wherein the LDPC code is characterized by an LDPC matrix that includes a plurality of sub-matrices arranged in a left hand side matrix and a right hand side matrix, wherein the right hand side matrix is lower triangular and includes all-zero-valued sub-matrices except for CSI (Cyclic Shifted Identity) sub-matrices located on a main diagonal of the right hand side matrix and another diagonal that is adjacently located to a left of the main diagonal;

puncturing a subset of the information bits and a subset of parity bits from the coded bits to generate a codeword; and via a communication interface of the communication device, transmitting a signal that includes the codeword to another communication device via a communication channel.

15. The method of claim 14 further comprising:

adding a plurality of zero-valued fill bits to the information bits before encoding using the LDPC code; and shortening the plurality of zero-valued fill bits from the coded bits before puncturing the subset of the information bits and the subset of parity bits.

16. The method of claim 14 further comprising:

transmitting the signal via a Physical Layer (PHY) Link Control (PLC) sub-channel used for ranging or a Next Codeword Pointer (NCP) sub-channel used for locating at least one additional codeword, wherein the communication channel includes the PLC sub-channel and the NCP sub-channel.

17. The method of claim 14 further comprising:
encoding other information bits using an forward error correction (FEC) code to generate data bits; and
transmitting another signal that includes the data bits to the another communication device via a data sub-channel of the communication channel.

18. The method of claim 14 further comprising:
generating another codeword;
generating cyclic redundancy check (CRC) bits based on the codeword and the other codeword; and
transmitting one or more signals that include the codeword, the other codeword, and the CRC bits to the another communication device via the communication channel.

19. The method of claim 14, wherein the communication device is a cable modem, and the another communication device is a cable headend transmitter or a cable modem termination system (CMTS).

20. The method of claim 14 further comprising:
operating the communication interface of the communication device to support communications within at least one of a satellite communication system, a wireless communication system, a wired communication system, a fiber-optic communication system, or a mobile communication system.

* * * * *